Dec. 6, 1966 R. A. RODNER 3,290,606

ELECTRONIC CIRCUIT PRODUCING PULSE SEQUENCES OF DIFFERENT RATES

Filed Sept. 27, 1963 3 Sheets-Sheet 1

INVENTOR.
ROBERT A. RODNER
BY John V. Regan
Attorney

Dec. 6, 1966
R. A. RODNER
3,290,606
ELECTRONIC CIRCUIT PRODUCING PULSE SEQUENCES OF DIFFERENT RATES
Filed Sept. 27, 1963
3 Sheets-Sheet 2

INVENTOR.
ROBERT A. RODNER
BY John V. Regan
Attorney

Dec. 6, 1966

R. A. RODNER 3,290,606

ELECTRONIC CIRCUIT PRODUCING PULSE SEQUENCES OF DIFFERENT RATES

Filed Sept. 27, 1963

3 Sheets-Sheet 3

INVENTOR.
ROBERT A. RODNER
BY John V. Regan
Attorney

United States Patent Office 3,290,606

Patented Dec. 6, 1966

3,290,606

ELECTRONIC CIRCUIT PRODUCING PULSE SEQUENCES OF DIFFERENT RATES

Robert A. Rodner, Lake Park, Fla., assignor to Radio Corporation of America, a corporation of Delaware Filed Sept. 27, 1963, Ser. No. 312,099
8 Claims. (Cl. 328—62)

This invention relates to pulse generating systems, and more particularly to improved systems for generating sequences of pulses.

In many electronic systems, the operation of various units is controlled by sequences of timing or clock pulses provided by a special pulse generator. These timing pulses are used, for example, to insure that the various units are properly synchronized and operate at preselected times. It is conventional to design the logic and gating circuits of the various units so as to operate at a predetermined frequency or repetition rate. The sytsem timing pulse rate then is maintained at this predetermined rate by using a high precision oscillator circuit such as a crystal controlled oscillator. A desired pulse sequence according to one arrangement is generated by coupling logic circuits and delay lines in suitable fashion to the oscillator to provide desired pulses at specified times. Another arrangement for generating pulse sequences is to use the oscillator pulses to drive a shifting type register or ring counter with the various stages providing the desired pulses of the sequence.

In such arrangements, however, the repetition rate of the pulses of the sequence is fixed by the response time of the logic circuits or the shifting register. For example, a shifting register using circuits designed for a 500 kilocycle frequency is not suitable for providing a one megacycle repetition rate pulse sequence, and so on.

It is often desirable to have a pulse generator which is capable of operating at different repetition rates, particularly rates higher than the predetermined rate of the individual logic circuits used in the generator.

Also, certain systems require different length pulse sequences for different system operations. One method of generating these variable pulse sequences, for example, is to provide a separate generator for each different sequence and to selectively activate the generator corresponding to the desired sequence. In general, such variable sequence clock pulse generators require a relatively complex interconnection of the circuits and are relatively expensive.

It is an object of the present invention to provide an improved pulse generator capable of producing pulse sequences at different repetition rates.

Another object of the present invention is to provide an improved pulse generator capable of producing variable pulse sequences.

A timing pulse generator in accordance with the present invention includes two shifting registers. The stages in each register are connected to each other in ordered fashion. The output of the lowest order stage of one register also is applied as an input to the lowest order stage of the second register. Signals inserted in the registers are shifted in response to signals from an oscillator. Oscillator pulses of one phase are coupled to shift inputs of the first register while the other phase oscillator pulses are coupled to shift inputs of the second register. A set of decoding gates each having inputs connected to certain stages of both registers provide the sequence of timing pulses in response to the signals inserted in the registers and the oscillator pulses.

Moreover, the arrangement of the register stages and the decoding gates, as described above, requires fewer register stages to generate a sequence of timing pulses than the prior arrangements.

An important feature of the invention is the production of timing pulses which have a repetition rate (or frequency) which is a multiple or a sub-multiple of the oscillator frequency. For example, by using two-input decoding gates, the timing pulses may have a repetition rate which is a multiple or a sub-multiple of the oscillator frequency. By using three-input decoding gates, the timing pulses may have still another different repetition rate than the oscillator frequency.

Another feature of the invention is that the generator may be easily arranged to produce either single or recurrent sequences of particular timing pulses, as desired.

Figure 1:
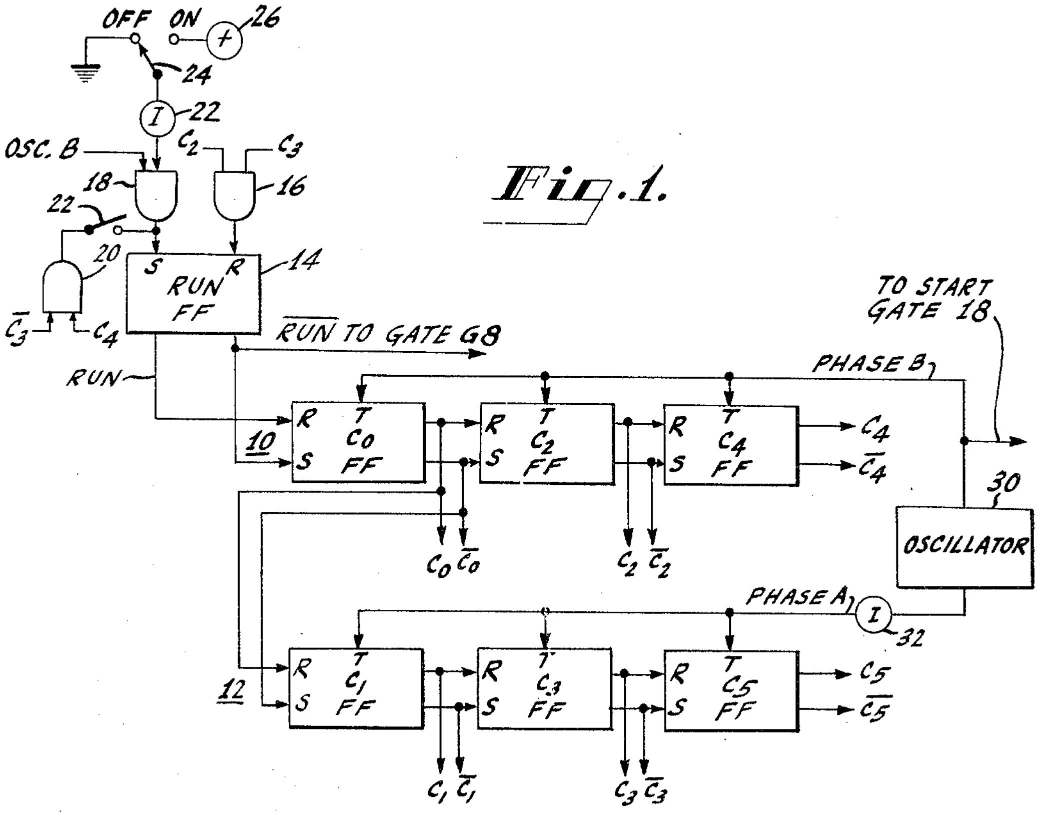
FIGURE 1 is a schematic diagram of an arrangement of registers in accordance with the invention.
Figure 2:
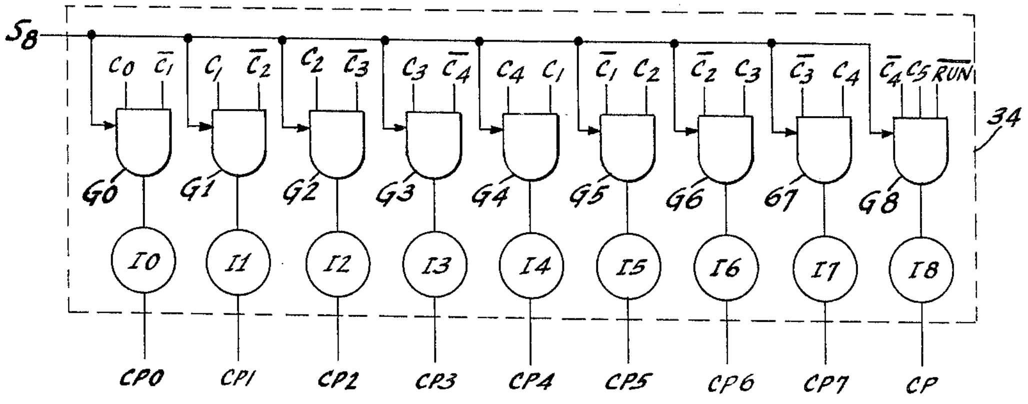
FIGURE 2 is a schematic diagram of one decoder unit useful with the registers of FIGURE 1.
Figures 3A, 3B, 3C:
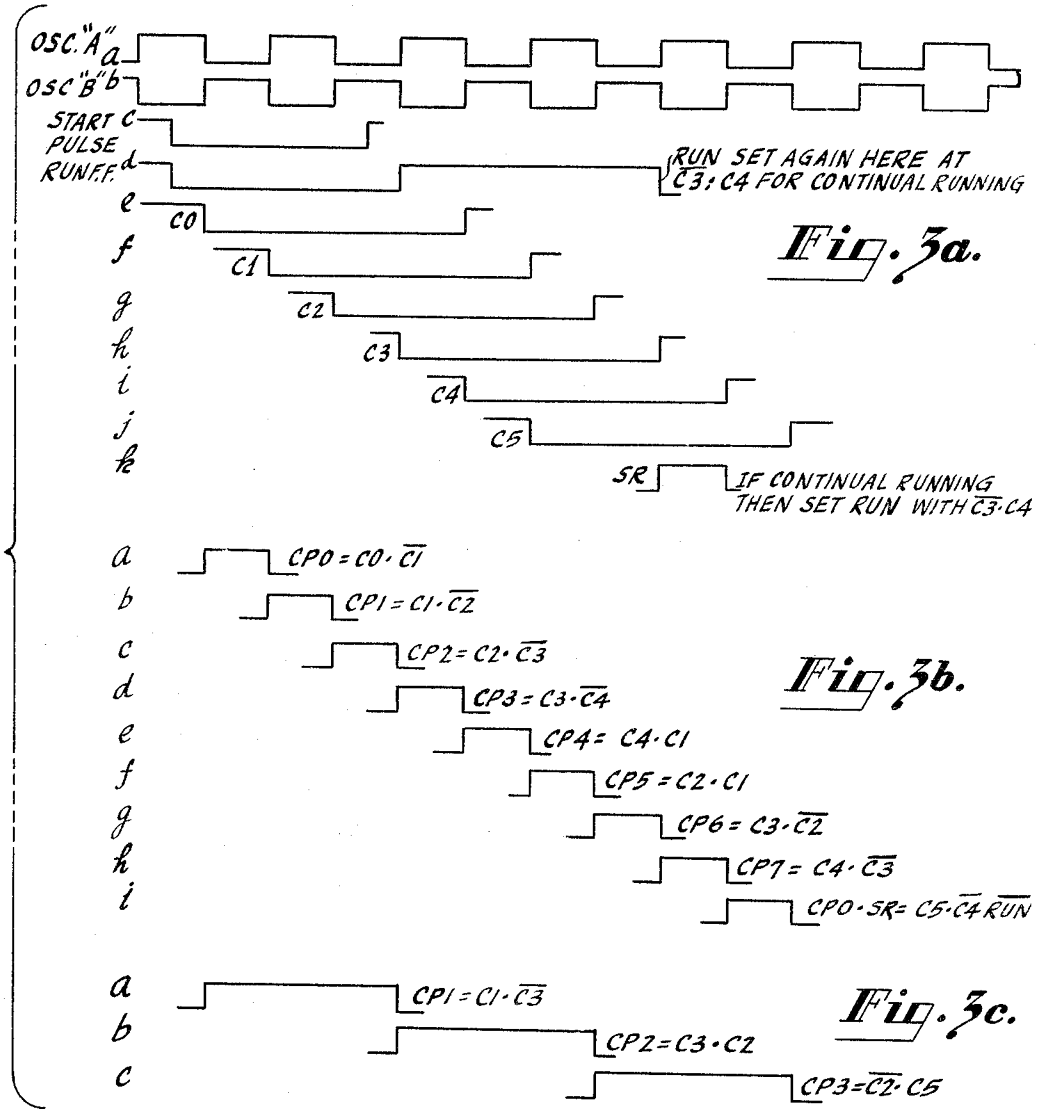
Figure 4:
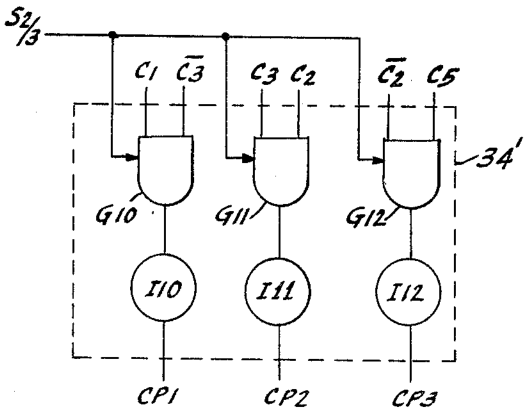
Figure 5:
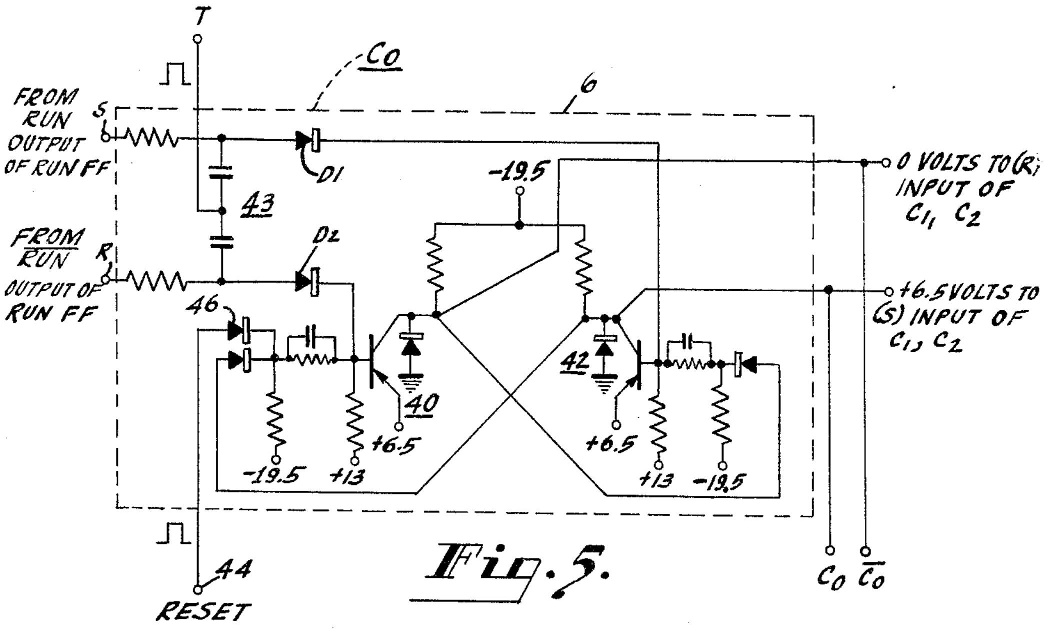

FIGURES 3*a*, 3*b* and 3*c*, all to the same scale, are timing diagrams useful in explaining the operation of the timing pulse generator;

FIGURE 4 is a schematic diagram of another decoder unit useful with the registers of FIGURE 2; and FIGURE 5 is a schematic diagram of a register stage suitable for use in the circuit of FIGURE 1.

The pulse generator of FIGURE 1 includes first and second registers 10 and 12. In the illustrative embodiment, each of the registers is provided with three stages by way of example. Registers with more or less than three stages can be used as necessary or desired. A large number of stages would provide more pulses per sequence whereas fewer stages would provide fewer pulses per sequence. The three stage C0, C2 and C4 of register 10 are connected in cascade by connecting the respective outputs of lower order stages to respective inputs of the higher order stages. The register 12 has stages C1, C3 and C5 similarly connected in cascade. The outputs of the stage C0 of the first register 10 are also connected to the respective inputs of the first stage C1 of the second register 12.

Each register stage comprises a triggerable flip-flop having set and reset inputs and corresponding outputs. For convenience, the output of the flip-flop corresponding to the set state is designated by the flip-flop number, i.e., C0, and the output corresponding to the reset state is labeled with the flip-flop number with a bar over it, i.e., $\overline{C0}$. The two outputs of the flip-flop, for example C0 and $\overline{C0}$, are complementary, that is, when one is at a high level the other is at a low level, and vice versa. Each of the flip-flops is arranged so that when it is in the set condition, the unbarred output is relatively low and when it is in the reset condition, the barred output is relatively low. Each of the flip-flops also has a trigger or shift input (T). A register flip-flop is placed in the set or reset condition by first applying a relatively high level to an appropriate one of the inputs and then applying a relatively high level trigger pulse to the trigger input T. The register flip-flops also may be reset directly by a common reset input not shown in FIGURE 1. Details of a suitable flip-flop circuit for use in the generator of FIGURE 1 are discussed later in connection with FIGURE 5.

The set and reset inputs of the C0 flip-flop of the register 10 are connected, respectively, to the Run and $\overline{\text{Run}}$ outputs (the complementary outputs) of a Run flip-flop 14. The Run flip-flop 14 is reset by the output of a gate 16. The gate 16 and each of the other gates described herein may be transistor type logic gates each performing the NAND (not "and") logic function. The set input of the Run flip-flop 14 is controlled by the output signal of a start gate 18 and a stop gate 20. The stop gate 20 is connected by way of a single-pole, single-throw stop switch 22 to the set input of the flip-flop 14. The start gate 18 has one input connected by way of an inverter 22 (which may be a single input NAND gate) and one terminal of a single-pole, double-throw switch 24 to a source 26 of bias voltage. An inverter is indicated in the drawing by a circle. The second or "off" terminal of the switch 24 is connected to circuit ground. The switch 24 is indicated as a mechanical switch, however, in practice an electronic switch can be used. For example, the switch 24 and inverter 22 can be replaced by a single NAND gate with a start pulse applied to its base input.

Oscillator 30 pulses of one phase labeled "B" in the drawing are applied to the second input of the start gate 18. The oscillator 30 may be a free-running, square-wave oscillator which is crystal controlled. The phase B pulses, when of positive polarity, prevent the signal from inverter 22 from activating start gate 22. The phase B oscillator pulses also are applied to the trigger inputs (T) of the register 10 stages. The oscillator 30 pulses are coupled by inverter 32 to the trigger inputs (T) of the register 12 stages. The inverter 32 outputs labeled phase "A" in the drawing are 180° out of phase with respect to the phase "B" pulses.

Certain outputs of the C0–C5 register stages are applied to the inputs of a decoder 34. One arrangement of a decoder 34 is shown in FIGURE 2. This particular decoder is arranged to supply an output pulse sequence at twice the repetition rate of the oscillator 30. A set of nine two-input gates G0–G8 receives the outputs of the register flip-flops. The gate G0 receives the C0 and $\overline{C1}$ signals, the gate G1 receives the C1 and $\overline{C2}$ signals, and so on, with each of the gates receiving a different pair of signals, one from a stage of register 10 and the other from a stage of the register 12. The gate G8 also receives the $\overline{Run}$ signal from the Run flip-flop 14. An additional input from a command line S8 may, for reasons discussed later, be coupled to all the decoder gates. However, the line S8 is not necessary for the operation of the decoder and can be omitted.

The gates of decoder 34 provide a sequence of positive polarity clock pulses. It is assumed, however, that the pulse generator is to be used in providing timing pulses for a system employing NAND logic gates. Hence, a set of inverters 10–18 is used to invert the positive-going outputs of the gates G0–G8 to produce a sequence of negative-going polarity clock pluses.

The operation of the timing pulse generator will be explained in connection with the following table and the timing diagram of FIGURE 3*a*. Successive rows of the Table, below, correspond to the conditions of the flip-flops during successive A and B phases of the oscillator pulses. The "1" and "0" in the A and B columns indicate positive polarity pulses of the A and B phases. A "1" in one of the C0–C5 and R columns indicates that the flip-flop designated by that column is in the set condition during the particular A or B oscillator pulse. A "0" in a column indicates the designated flip-flop is reset during the particular oscillator pulse.

Initially, the register stages and the Run flip-flop are all in the reset condition and all the barred outputs are at a relatively low level. When the start switch 24 (FIGURE 1) is momentarily thrown to the "on" terminal, the inverter 22 applies a relatively "low" enabling level to start gate 18. The coincidence of this enabling level with a negative going phase B pulse activates the start gate 18 to apply a "high" level pulse to the set input of Run flip-flop 14 causing its Run output to be "high." The high Run output enables the set input of the C0 stage. The start switch 24 can then be returned to its "off" position after the Run flip-flop is set. Lines *a, b, c* and *d* of the FIGURE 3*a* timing diagram indicate this start sequence. In the case of an electronic start switch, a start pulse is applied from any suitable source to enable the start gate 18. The flip-flop states at this time are indicated in line (1) of the table. The next phase B pulse sets the C0 stage causing its $\overline{C0}$ output to go high thereby enabling the set inputs of the C1 and C2 stages. The states of the flip-flops at this time are indicated in line (2) of the table. At this time the first decoder gate G0 (FIGURE 2) is activated initiating the first timing pulse CP0 since both the C0 and $\overline{C1}$ inputs are "low."

As indicated in line (3) of the table, the next phase A oscillator pulse sets the C1 flip-flop causing its C1 output to be low, thereby enabling the second decoder gate G1 and enabling the set input of the register stage C3. At this time the first timing pulse CP0 is terminated and the second timing pulse CP1 is initiated due to the presence of the low level C1 and $\overline{C2}$ signals. The following phase B pulse sets the C2 flip-flop causing its C2 output to be low. The C0 flip-flop remains set because of the low Run output from the Run flip-flop. At this time the second timing pulse CP1 is terminated and the third timing pulse CP2 is initiated due to the presence of the low level C2 and $\overline{C3}$ signals.

The next phase A pulse sets the C3 flip-flop causing the C3 output to be low. The C1 flip-flop remains set due to the presence of the low level "1" input from the C0 flip-flop. The states of the various flip-flops at this time are indicated in line (5) of the table. At this time the third timing pulse CP2 is terminated and the fourth timing pulse CP3 is initiated due to the low level C3 and $\overline{C4}$ signals. Also, the Run flip-flop is reset by the output of the reset gate 16 which is enabled at both its inputs by the low level C2 and C3 signals. The C0 flip-flop now has a high level applied to its reset input. The action of the Run flip-flop is indicated at line *d* of FIGURE 3*a*. The action of the register flip-flops C0–C5 is indicated at lines *e–j*, respectively, of FIGURE 3*a*.

The following phase B pulse changes the C0 flip-flop to a reset condition and sets the C4 flip-flop. The C2 flip-flop remains set due to the enabling level applied during this phase B pulse by the C0 flip-flop. At this time the fourth timing pulse CP3 is terminated and the fifth timing pulse CP4 is initiated due to the presence of the low level C1 and C4 inputs to the gate G4. The states of the flip-flops at this time are indicated in line (6) of the table.

*Table*

| | Phase A | Phase B | C0 | C1 | C2 | C3 | C4 | C5 | Run | Timing Pulse |
|---|---|---|---|---|---|---|---|---|---|---|
| (1) | 1 | 0 | 0 | 0 | 0 | 0 | 0 | 0 | 1 | |
| (2) | 0 | 1 | 1 | 0 | 0 | 0 | 0 | 0 | 1 | CPO. |
| (3) | 1 | 0 | 1 | 1 | 0 | 0 | 0 | 0 | 1 | CP1. |
| (4) | 0 | 1 | 1 | 1 | 1 | 0 | 0 | 0 | 1 | CP2. |
| (5) | 1 | 0 | 1 | 1 | 1 | 1 | 0 | 0 | 0 | CP3. |
| (6) | 0 | 1 | 0 | 1 | 1 | 1 | 1 | 0 | 0 | CP4. |
| (7) | 1 | 0 | 0 | 0 | 1 | 1 | 1 | 1 | 0 | CP5. |
| (8) | 0 | 1 | 0 | 0 | 0 | 1 | 1 | 1 | 0 | CP6. |
| (9) | 1 | 0 | 0 | 0 | 0 | 0 | 1 | 1 | 1 | CP7. |
| (10) | 0 | 1 | 1 | 0 | 0 | 0 | 0 | 1 | 1 | Stop or CP0. |
| (11) | 1 | 0 | 1 | 1 | 0 | 0 | 0 | 0 | 1 | CP1. |

The following phase A pulse changes the C1 flip-flop to the reset condition because of the enabling level from the reset C0 flip-flop and sets the C5 flip-flop due to the enabling level from the set C3 flip-flop. At this time the fifth timing pulse CP4 is terminated and the sixth timing pulse CP5 is initiated due to the low $\overline{C1}$ and C2 inputs to gate G5.

The following phase B pulse changes the C2 flip-flop to the reset state due to the enabling level from the reset C0 flip-flop. At this time the sixth timing pulse CP5 is terminated and the seventh timing pulse CP6 is initiated due to the low level $\overline{C2}$ and C3 inputs to the gate G6.

The following phase A pulse changes the C3 flip-flop from the set to the reset condition due to the enabling level output from the reset C1 flip-flop. The flip-flop states at this time are indicated in line (9) of the table. At this time the seventh timing pulse CP6 is terminated and the eighth timing pulse CP7 is initiated due to the presence of the low level $\overline{C3}$ and C4 inputs applied to the gate G7.

The $\overline{C3}$ and C4 inputs are also applied to the stop gate 20 and when the stop switch is in the closed position, the Run flip-flop is changed from the reset to the set condition during the phase A pulse as indicated at line *k* of FIGURE 3*a*. If the stop switch 22 is open (as shown), the Run flip-flop remains reset. In such case, line (9) of the table would indicate a "0" in the Run flip-flop column.

Assuming the stop switch 22 to be open, the Run flip-flop remains reset and the $\overline{\text{Run}}$ level is low. Hence, the gate G8 now is activated due to the low level inputs and the final pulse of the sequence corresponding to a stop condition is initiated. The following phase A pulse changes the C5 flip-flop from the set to the reset condition due to the high level "0" output from the C3 flip-flop. At this time the C5 input to the decoder gate G8 is high terminating the stop pulse. Thus, at this point in the operation each of the register stages C0–C5 have been returned to the initial reset condition.

If it is desired to continuously generate the sequences of timing pulses, then the stop switch 22 is placed in the closed position. The $\overline{C3}$, C4 signals then change the Run flip-flop to the set condition as indicated in line (9) of the table. The next phase B pulse then changes the C0 flip-flop to the set condition and the C4 flip-flop to the reset condition. At this time the eighth timing pulse CP7 is terminated and the $\overline{C4}$ and C5 inputs to the decoder gate G8 are both high. However, at this time the Run flip-flop is in the set condition due to the closing of the stop switch 22, hence the $\overline{\text{Run}}$ level is high and the gate G8 is not activated.

Thus, after the eighth timing pulse CP7, a new timing pulse CP0 is generated due to the presence of the C0 and $\overline{C1}$ high inputs as indicated in line (10) of the table. The second and subsequent sequences of timing pulses are then generated as described above until the stop switch 20 is changed to the open position.

The timing diagram of FIGURE 3*b* indicates the relationship of the sequence of clock pulses generated by decoder 34 with respect to the control signals of FIGURE 4.

FIGURE 4 is a schematic diagram of another embodiment of a decoder 34′ arranged to provide timing pulse sequences having a repetition rate two-thirds that of the oscillator frequency. The decoder includes, for example, three two-input NAND gates G10–G12. The first gate G10 receives inputs C1 and $\overline{C3}$, the second gate G11 receives the inputs C2 and C3 and the third gate G12 receives the inputs $\overline{C2}$ and $\overline{C5}$. An additional command line S2/3 may be coupled to each of the decoder gates as an enabling input. However, the command line S2/3 also is not necessary for the operation of the decoder 34′ and can be omitted.

The operation of a system using a decoder 34′ is similar to that described in connection with the decoder of FIGURE 2. Referring to the above table, for example, it is seen that the timing pulse from gate G10 of the decoder is initiated when the stage C1 is set and this timing pulse continues for three half cycles of the oscillator until the stage C3 is set. The second timing pulse C21 from gate G11 is initiated when the stage C3 is set and continues for three half cycles of the oscillator until the stage C2 is set. The third time pulse CP2 from gate G12 is initiated when the stage C2 is reset and continues for three half cycles of the oscillator when the stage C5 is set. Thus, the decoder of FIGURE 4 produces one timing pulse for each three half cycles of the oscillator. The timing diagram of FIGURE 3*c* indicates the relation between the decoder 34′ output pulses and the signals from the register stages. Other decoder arrangements may be provided using three or more inputs from the registers to control the number and repetition rate of the pulse sequence.

Different pulse sequences can be obtained on command by coupling both the decoders of FIGURES 2 and 4 to the register stages. An additional command lines S8 is coupled to all the gates of the decoder 34, and another command line S2/3 is coupled to all the gates of the decoder 34′. In operation when an eight pulse sequence is desired the command line S8 is activated by any suitable means to enable the decoder 34 gates. When a three pulse sequence is desired the S2/3 command line is activated enabling the decoder 34′ gates. In certain instances both command line S8 and S2/3 can be activated to produce both sets of pulse sequences.

FIGURE 5 is a schematic diagram of a flip-flop suitable for use in register stage. The flip-flop of stage C0, for example, comprises a pair of transistor NAND gates 40 and 42 of known type. The transistors are of PNP type and have their respective collector-base electrodes cross-coupled to each other via a coupling diode and a base input resistor. A speed-up capacitor is connected in parallel with the base resistor. The emitter electrodes are connected to a positive bias indicated as +6.5 volts. The collector electrodes are connected by resistors to a negative supply potential indicated as —19.5 volts. The collectors are also clamped close to ground potential by clamp diodes. Bias potentials of +13 and —19.5 volts are resistor coupled across the base input resistors. The trigger input (T) is coupled by way of a pulse steering network 43 to the bases of the transistors. Each branch of the network 43 includes a capacitor and a diode D1 or D2. Separate resistors connected to the set and reset inputs are used to forward bias one of the steering diodes. A common reset terminal 44 may be connected by way of diode 46 to the base input resistor of the gate 40. The C0 and $\overline{C0}$ output terminals are connected, respectively, to the collectors of the transistors 42 and 40.

In operation, the collectors potential of a NAND gate is low, i.e., close to ground potential, when any one of its inputs is high, and is high, i.e., close to 6.5 volts, when all its inputs are low. The flip-flop is arranged so that one transistor is conducting, producing a "high" output and the other is nonconducting, producing a "low" output. In the set state, the transistor 40 is conducting, hence the C0 output is "high" and the $\overline{C0}$ output is "low." The high $\overline{C0}$ output is coupled as an enabling input to the steering diode D1 of the register stages C2 and C1. In the reset state the transistor 42 is conducting, hence the C0 output is "high" and the $\overline{C0}$ output is "low." The "high" $\overline{C0}$ output is applied as an enabling input to the steering diode D2 of the register stages C1 and C2. A positive polarity trigged pulse applied to trigger input (T) is coupled via the forward biased steering diode to the base of the connected transistor turning this transistor to the nonconducting condition, if it is not already there.

A positive reset pulse applied to common reset input 44 is passed by diode 46 to change the transistor gate 40 to the nonconducting condition, if it is not already nonconducting, thereby resetting the flip-flop.

What is claimed is:

1. A pulse generator comprising,
a first register having a plurality of flip-flops connected in cascade,
a second register comprising a plurality of flip-flops connected in cascade,
each of said flip-flops having set and reset inputs and corresponding outputs, and a trigger input for setting the flip-flop to a state determined by the set and reset inputs, said cascade connection of each of said first and said second register including circuit means connecting said set and reset inputs of said flip-flops to respective outputs of preceding ones of said flip-flops within each of said first and said second register
an oscillator,
means for applying one phase of oscillator pulses to the trigger inputs of said first register flip-flops,
means for applying the other phase oscillator pulses to the trigger inputs of said second register flip-flops, said other oscillator pulses being 180° out of phase with respect to said one phase pulses, and
a decoder comprising a plurality of gates, a different one for each output pulse to be produced,
each of said gates having inputs connected to outputs of certain flip-flops of both of said registers,
said gates producing output pulses which have a different repetition rate from that of said oscillator.

2. A pulse generator as recited in claim 1, including, means for applying said inputs to the lowest order flip-flop of said first register to initiate a pulse sequence, and
means for applying at a later time reset inputs into said lowest order first register flip-flops for terminating said pulse sequence.

3. A pulse generator as recited in claim 1, including, means for applying said inputs to said lowest order flip-flop of said first register to initiate a pulse sequence,
means responsive to outputs of certain of said gates to apply reset inputs to said lowest order flip-flop of said first register for terminating said pulse sequence, and
means including switch means responsive to outputs of certain others of said gates for applying set inputs to said lowest order flip-flop of said first register to initiate a new pulse sequence.

4. A pulse generator comprising,
first and second flip-flop registers each having m flip-flops,
the flip-flops of each register being connected in an ordered sequence with the both outputs of the lowest order flip-flop of a first of said registers being applied as respective inputs to the lowest order flip-flop of the second of said registers,
an oscillator producing output signals,
said oscillator signals being applied directly to said first register flip-flops and said oscillator signals being inverted and applied to said second register flip-flops, and
a decoder comprising a plurality of n gates, where $n$ is different from $2m$,
each said gate having one input connected to an output of said first register and another input connected to an output of said second register,
successive ones of said gates being activated and deactivated in synchronism with said oscillator signals.

5. A pulse generator as recited in claim 4 including, means for applying said input signals to the lowest order flip-flop of said first register, and
means responsive to said first and second outputs for providing reset inputs to said lowest order flip-flop of said first register.

6. A pulse generator as recited in claim 4 where $n$ is greater than $2m$.

7. A pulse generator as recited in claim 4 where $n$ is less than $2m$.

8. A pulse generator as recited in claim 5, including, further means responsive to certain other of said gate outputs for applying an additional start input to said lowest order flip-flop of said first register to initiate another pulse sequence.

References Cited by the Examiner

UNITED STATES PATENTS

| | | | |
|---|---|---|---|
| 2,762,915 | 9/1956 | Bagley | 328—48 X |
| 2,834,011 | 5/1958 | Mork | 328—48 |
| 3,050,714 | 8/1962 | Cambell | 328—48 X |
| 3,107,332 | 10/1963 | Paoletti et al. | 328—72 X |
| 3,162,816 | 12/1964 | Rakoczi et al. | 328—92 |
| 3,168,700 | 2/1965 | Gesek et al. | 328—75 X |
| 3,212,010 | 10/1965 | Podlesny | 328—63 |

ARTHUR GAUSS, *Primary Examiner.*

B. P. DAVIS, *Assistant Examiner.*